United States Patent
Li et al.

(10) Patent No.: US 10,886,185 B2
(45) Date of Patent: Jan. 5, 2021

(54) ELECTRICAL COMPONENT TESTING IN STACKED SEMICONDUCTOR ARRANGEMENT

(71) Applicant: Taiwan Semiconductor Manufacturing Company Limited, Hsin-Chu (TW)

(72) Inventors: Shao-Yu Li, Hsinchu (TW); Hao-chieh Chan, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 155 days.

(21) Appl. No.: 15/354,269

(22) Filed: Nov. 17, 2016

(65) Prior Publication Data

US 2017/0069552 A1    Mar. 9, 2017

Related U.S. Application Data

(62) Division of application No. 14/560,321, filed on Dec. 4, 2014, now Pat. No. 9,502,315.

(60) Provisional application No. 61/911,662, filed on Dec. 4, 2013.

(51) Int. Cl.

| | |
|---|---|
| *H01L 21/66* | (2006.01) |
| *H01L 27/06* | (2006.01) |
| *G01R 31/26* | (2020.01) |
| *G01R 31/28* | (2006.01) |
| *G01R 31/3185* | (2006.01) |

(52) U.S. Cl.
CPC .......... *H01L 22/22* (2013.01); *G01R 31/2637* (2013.01); *G01R 31/2644* (2013.01); *G01R 31/2884* (2013.01); *H01L 22/14* (2013.01); *H01L 22/34* (2013.01); *H01L 27/0688* (2013.01); *G01R 31/318513* (2013.01)

(58) Field of Classification Search
CPC ..... H01L 22/14; H01L 22/34; H01L 27/0688; G01R 31/2644; G01R 31/3884; G11C 29/50012; H01J 37/3174–3177
See application file for complete search history.

(56) References Cited

U.S. PATENT DOCUMENTS

| | | | | |
|---|---|---|---|---|
| 6,870,172 B1 * | 3/2005 | Mankos | ................ | B82Y 10/00 250/492.22 |
| 7,358,512 B1 * | 4/2008 | Lordi | .................... | B82Y 10/00 250/396 R |
| 7,692,167 B1 * | 4/2010 | Mankos | ................ | B82Y 10/00 250/492.22 |
| 7,816,655 B1 * | 10/2010 | Hess | .................. | H01J 37/3175 250/396 R |
| 8,063,365 B1 * | 11/2011 | Standiford | ............ | G01N 23/04 250/306 |
| 8,253,119 B1 * | 8/2012 | Brodie | ............... | H01J 37/3175 250/306 |
| 8,373,144 B1 * | 2/2013 | McCord | ................ | G21K 1/087 250/396 R |
| 8,642,981 B1 * | 2/2014 | Petric | .................. | H01J 37/3005 250/306 |

(Continued)

*Primary Examiner* — Brigitte A Paterson
(74) *Attorney, Agent, or Firm* — Cooper Legal Group, LLC (57) ABSTRACT

A stacked semiconductor arrangement is provided. The stacked semiconductor arrangement includes a dynamic pattern generator layer having an electrical component. The arrangement also includes a monitoring layer configured to evaluate electrical performance of the electrical component.

20 Claims, 5 Drawing Sheets

(56) References Cited

U.S. PATENT DOCUMENTS

| | | | |
|---|---|---|---|
| 9,040,942 B1* | 5/2015 | Standiford | H01J 37/3007 |
| | | | 250/396 R |
| 2007/0029506 A1* | 2/2007 | Zywno | B82Y 10/00 |
| | | | 250/491.1 |
| 2008/0169436 A1* | 7/2008 | Carroll | B82Y 10/00 |
| | | | 250/492.22 |
| 2013/0069678 A1* | 3/2013 | Grosch | G01R 31/30 |
| | | | 324/750.02 |
| 2013/0105108 A1* | 5/2013 | Zywno | H01J 37/20 |
| | | | 165/11.1 |
| 2013/0134324 A1* | 5/2013 | Brodie | H01J 23/06 |
| | | | 250/398 |
| 2013/0293865 A1* | 11/2013 | Ummethala | H01J 37/20 |
| | | | 355/75 |
| 2013/0342827 A1* | 12/2013 | Ummethala | G01B 11/14 |
| | | | 356/72 |
| 2014/0097362 A1* | 4/2014 | Carroll | B82Y 40/00 |
| | | | 250/492.22 |
| 2014/0199618 A1* | 7/2014 | Mieher | G03F 7/2059 |
| | | | 430/30 |

\* cited by examiner

ELECTRICAL COMPONENT TESTING IN STACKED SEMICONDUCTOR ARRANGEMENT

RELATED APPLICATIONS

This application is a divisional of and claims priority to U.S. patent application Ser. No. 14/560,321, titled, "ELECTRICAL COMPONENT TESTING IN STACKED SEMICONDUCTOR ARRANGEMENT" and filed on Dec. 4, 2014, which claims priority to U.S. Provisional Patent Application 61/911,662, titled ""ELECTRICAL COMPONENT TESTING IN STACKED SEMICONDUCTOR ARRANGEMENT" and filed on Dec. 4, 2013. U.S. patent application Ser. No. 14/560,321 and U.S. Provisional Patent Application 61/911,662 are incorporated herein by reference.

BACKGROUND

A dynamic pattern generator is a mechanism used to transfer a pattern onto a wafer, such as by electron beam imaging. The dynamic pattern generator comprises a plurality of electrical components that facilitate the transfer of the pattern onto the wafer. When an electrical component of the dynamic pattern generator fails, issues with the pattern transfer may arise. For example, when an electrical component fails, the pattern may not be transferred onto the wafer accurately. When the pattern is not transferred to the wafer accurately, yield loss may occur. For example, when the pattern is not transferred to the wafer accurately, circuitry resulting from the pattern transfer may not function as intended. When circuitry does not function as intended, the wafer or a portion thereof that comprise the circuitry may have to be discarded, which results in yield loss.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more stacked semiconductor arrangements comprising a dynamic pattern generator layer of a dynamic pattern generator, or techniques for evaluating a dynamic pattern generator layer of a dynamic pattern generator are provided. A stacked semiconductor arrangement comprises a dynamic pattern generator layer that has one or more electrical components configured to facilitate transfer of a pattern onto a wafer. According to some embodiments, the wafer to which the pattern is transferred corresponds to a die, semiconductor substrate, etc.

The one or more electrical components of the dynamic pattern generator layer are configured to provide various types of functionality to facilitate the transfer of the pattern onto the wafer. According to some embodiments, an electrical component of the dynamic pattern generator layer is configured to place a pad into a low voltage state or a high voltage state. According to some embodiments, when the pad is placed into the high voltage state, the pad refracts an electron beam towards the wafer to facilitate pattern transfer. According to some embodiments, when the pad is placed into the low voltage state, the pad does not refract the electron beam but instead absorbs the electron beam. If the electrical component of the dynamic pattern generator layer is defective, then the electrical component will be unable to control the voltage at the pad or will control the voltage in a manner that leads to inaccurate pattern transfer, such as by applying no voltage or an incorrect voltage to the pad. When inaccurate pattern transfer occurs, less of the wafer is usable which leads to yield loss.

As provided herein, a monitoring layer of the stacked semiconductor arrangement is configured to evaluate electrical performance of one or more electrical components of the dynamic pattern generator layer, such as by measuring at least one of rise times, fall times, or delay times associated with electrical components. A repair layer of the stacked semiconductor arrangement is configured to repair a defective electrical component, such as by replacing or substituting the defective electrical component with a repair electrical component comprised within the repair layer. In this way, defective electrical components are identified and repaired to mitigate inaccurate pattern transfer caused by defective electrical components. When inaccurate pattern transfer is decreased, more of the wafer is usable which improves yield. Moreover, having the monitoring layer and the repair layer as separate from the dynamic pattern generator layer allows more features, elements, etc. to be formed on the dynamic pattern generator layer because features, elements, etc. of the monitoring layer and the repair layer are not part of the dynamic pattern generator layer. Allowing more features, elements, etc. to be formed on the dynamic pattern generator layer is desirable because there is an ongoing desire to make efficient use of semiconductor real estate.

Figure 1:
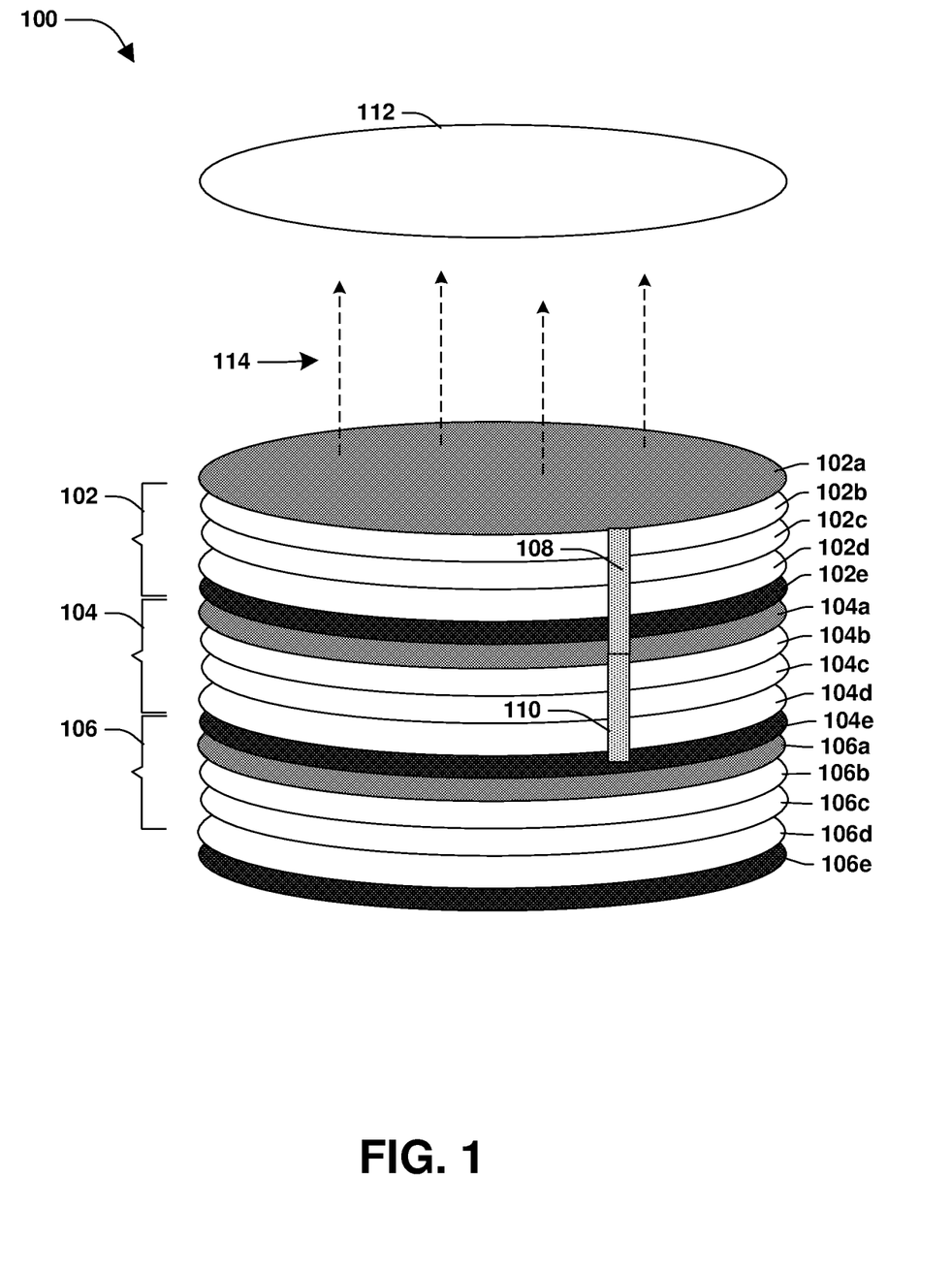
FIG. 1 is an illustration of a stacked semiconductor arrangement, according to some embodiments.

FIG. 1 illustrates a stacked semiconductor arrangement 100 wherein one or more layers of a dynamic pattern generator are comprised. According to some embodiments, the stacked semiconductor arrangement 100 is a stacked complementary metal oxide semiconductor (CMOS) structure. The stacked semiconductor arrangement 100 comprises one or more layers, such as a first layer 102, a second layer 104, a third layer 106, or other layers not illustrated. According to some embodiments, one or more of the layers 102, 104, 106, etc. themselves comprise multiple layers, such as metal layers, dielectric layers, etc., as illustrated by 102a-e, 104a-e and 106a-e in FIG. 1. In some embodiments, one or more elements, features, etc. of the layers are electrically connected to one another by vias. In some embodiments, an opening is formed through the first layer 102 to create a via 108 during processing of the first layer 102. In some embodiments, an opening is formed through the second layer 104 to create a via 110 during processing of the second layer 104. The via 108 and the via 110 connect elements, features, etc. of the first layer 102 to elements, features, etc. of the second layer 104.

In some embodiments, the stacked semiconductor arrangement 100 comprises a dynamic pattern generator layer configured to transfer a pattern to a wafer 112. In some embodiments, the dynamic pattern generator layer is formed within the first layer 102 such that the dynamic pattern generator directs one or more electron beams 114 towards the wafer 112 to form a pattern on the wafer 112. As provided herein, the stacked semiconductor arrangement 100 comprises a monitoring layer configured to evaluate electrical performance of electrical components within the dynamic pattern generator layer. In some embodiments, the monitoring layer comprises a built-in-self-test (BIST) layer comprising at least one of analog circuitry or digital circuitry configured to evaluate electrical performance of electrical components within the dynamic pattern generator layer. In some embodiments, the monitoring layer comprises an analog BIST layer comprising analog circuitry configured to evaluate electrical performance of electrical components within the dynamic pattern generator layer. In some embodiments, the monitoring layer comprises a digital BIST layer comprising digital circuitry configured to evaluate electrical performance of electrical components within the dynamic pattern generator layer. In some embodiments, the monitoring layer is formed within at least one of the second layer 104 or the third layer 106. In some embodiments, the stacked semiconductor arrangement 100 comprises a repair layer configured to repair defective electrical components. In some embodiments, the repair layer is formed within at least one of the second layer 104 or the third layer 106.

Figure 2:
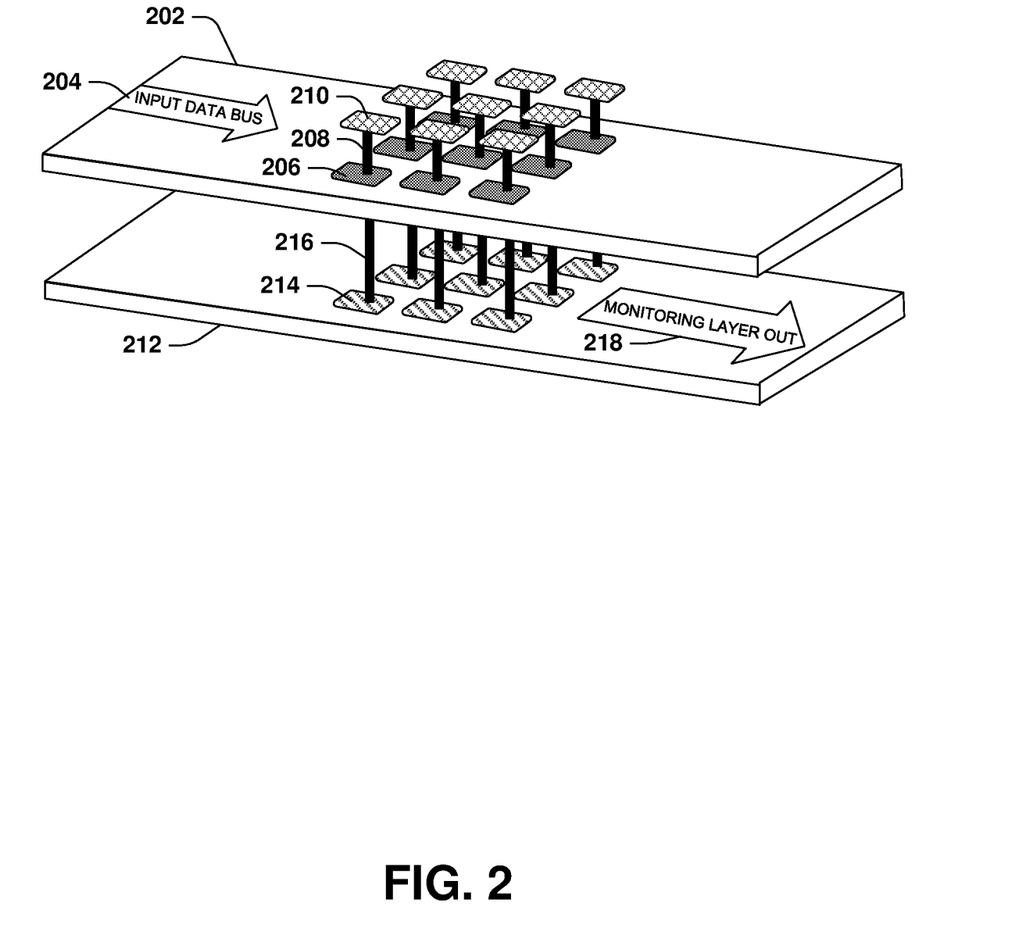
FIG. 2 is an illustration of a monitoring layer operatively coupled to a dynamic pattern generator layer, according to some embodiments.

An embodiment of a dynamic pattern generator layer 202 of a dynamic pattern generator is illustrated in FIG. 2. The dynamic pattern generator layer 202 comprises one or more electrical components, such as an electrical component 206. The electrical component 206 is operatively coupled to a pad 210, such as a metal pad, configured for electron beam refraction. In some embodiments, the electrical component 206 is operatively coupled to the pad 210 by a first via 208. In some embodiments, the dynamic pattern generator layer 202 is formed within the stacked semiconductor arrangement 100 illustrated in FIG. 1. In some embodiments, an electron beam refracted from the pad 210 facilitates pattern transfer onto the wafer 112. In some embodiments, the pad 210 is comprised within the dynamic pattern generator layer 202. In some embodiments, the pad 210 is comprised within an electron beam refraction layer separate from the dynamic pattern generator layer 202. In some embodiments, the electron beam refraction layer is formed within a first portion of the first layer 102 of the stacked semiconductor arrangement 100 illustrated in FIG. 1 and the dynamic pattern generator layer 202 is formed within a second portion of the first layer 102 of the stacked semiconductor arrangement 100 illustrated in FIG. 1. In some embodiments, the first portion of the first layer 102 is above the second portion of the first layer 102 such that the first portion is closer to the wafer 112 than the second portion.

In some embodiments, the dynamic pattern generator layer 202 comprises an input data bus 204. In some embodiments, the input data bus 204 comprises a plurality of data inputs operatively coupled to electrical components of the dynamic pattern generator layer 202, such as a first data input 204a and a second data input 204b, illustrated in FIG. 3. In some embodiments, at least one of the first data input 204a or the second data input 204b are operatively coupled to the electrical component 206. One or more of the data inputs are configured to drive the electrical component 206 to either a relatively higher voltage state or a relatively lower voltage state, as compared to a voltage state of the electrical component 206 prior to the one or more data inputs being applied to the electrical component 206. In some embodiments, the pad 210 is configured to refract the electron beam based upon the pad 210 being placed into the high voltage state by the electrical component 206. In some embodiments, the pad 210 is configured to not refract, such as absorb, the electron beam based upon the pad 210 being placed into the low voltage state by the electrical component 206. In some embodiments, the pad 210 is configured to refract an electron beam based upon the pad 210 being placed into the low voltage state by the electrical component 206. In some embodiments, the pad 210 is configured to not refract, such as absorb, the electron beam based upon the pad 210 being placed into the high voltage state by the electrical component 206. In this way, electrical components of the dynamic pattern generator layer 202 control whether pads refract or absorb electron beams, such as the electron beams 114 illustrated in FIG. 1, which in turn governs patterning of the wafer 112 as illustrated in FIG. 1.

In some embodiments, a monitoring layer 212 is coupled to the dynamic pattern generator layer 202 and is configured to evaluate electrical performance of the dynamic pattern generator layer 202. In some embodiments, the monitoring layer 212 is formed within the stacked semiconductor arrangement 100 illustrated in FIG. 1 and is configured to evaluate electrical performance of one or more layers in the stacked semiconductor arrangement 100. In some embodiments, the monitoring layer 212 is formed as a separate physical layer from the dynamic pattern generator layer 202 in the stacked semiconductor arrangement 100. In some embodiments, the monitoring layer 212 is formed above the dynamic pattern generator layer 202 in the stacked semiconductor arrangement 100. In some embodiments, the monitoring layer 212 is formed below the dynamic pattern generator layer 202 in the stacked semiconductor arrangement 100. In some embodiments, the monitoring layer 212 is formed as a stacked CMOS layer within the stacked semiconductor arrangement 100. In some embodiments, the monitoring layer 212 comprises an integrated circuit formed using CMOS technology. In some embodiments, the monitoring layer 212 is formed within at least one of the second layer 104 or the third layer 106 of the stacked semiconductor arrangement 100 illustrated in FIG. 1.

Figure 3:
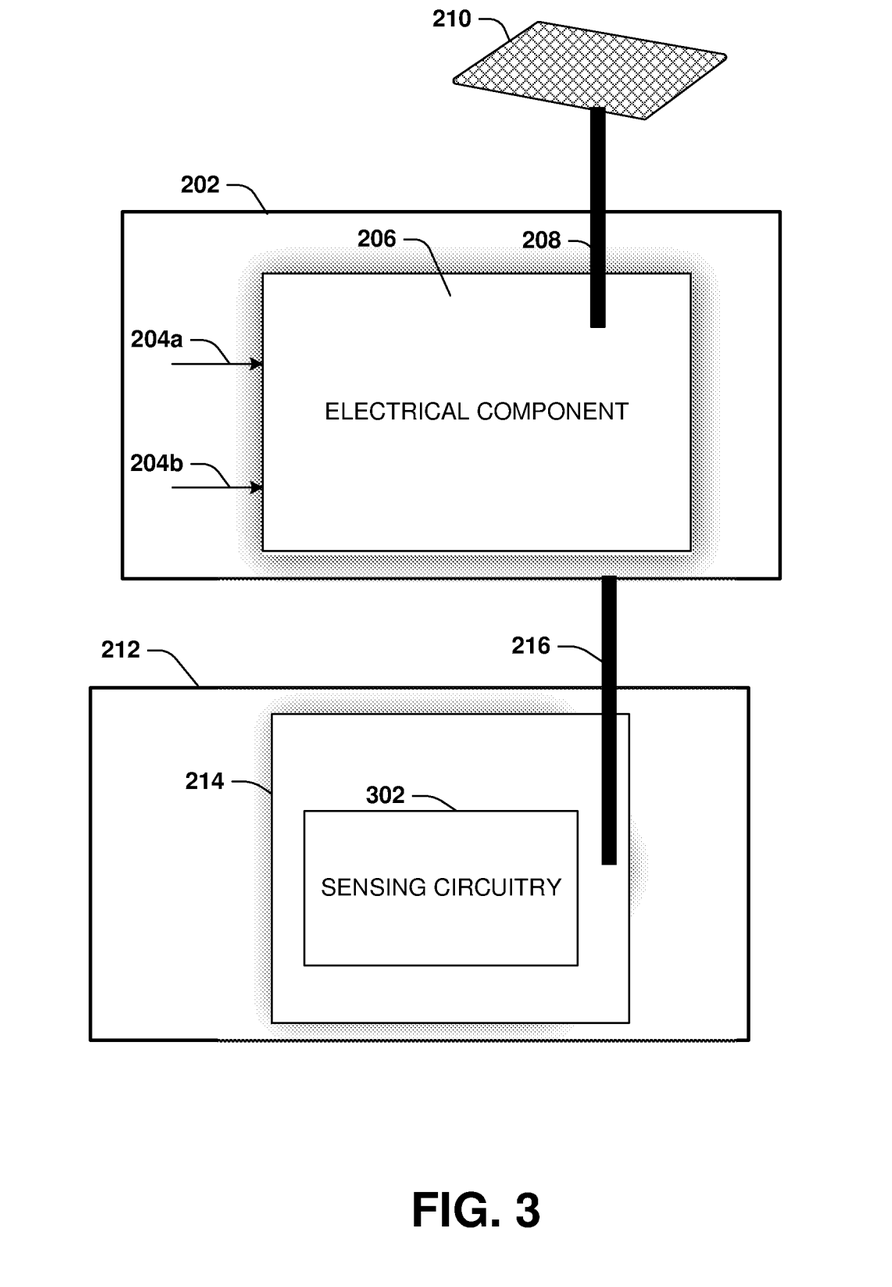
FIG. 3 is an illustration of a monitoring component operatively coupled to an electrical component, and the electrical component operatively coupled to a pad, according to some embodiments.

The monitoring layer 212 comprises one or more monitoring components configured to evaluate the electrical performance of the electrical components within the dynamic pattern generator layer 202, such as a monitoring component 214 operatively coupled to the electrical component 206 by a second via 216. In some embodiments, the monitoring component 214 comprises sensing circuitry 302, such as illustrated in FIG. 3, that senses electrical performance of the electrical component 206, including measurements of at least one of a rise time, a fall time, a delay time associated with the electrical component 206, or other performance metrics. In some embodiments, the sensing circuitry 302 determines such measurements by monitoring for specified voltage conditions and measuring time differences between such voltage conditions or measuring how long it takes to switch between such voltage conditions. Such measurements are processed to generate an output that is provided through a monitoring layer output bus 218 illustrated in FIG. 2. In some embodiments, the sensing circuitry 302 uses at least one of a voltage crossing-detector, a buffer, a time amplifier, a time-to-digital converter (TDC) or a parallel-serial convertor to determine such measurements. In this way, the monitoring layer 212 evaluates electrical performance of electrical components to identify defective electrical components for repair.

In some embodiments, the monitoring layer 212 is in an activated state during a time in which power is provided to the dynamic pattern generator layer 202 such that the monitoring layer 212 evaluates electrical performance of electrical components on the dynamic pattern generator layer 202 to identify defective electrical components for repair during electrical operation of the dynamic pattern generator layer 202. In some embodiments, the monitoring layer 212 is not in an activated state during a time in which power is not provided to the dynamic pattern generator layer 202 to conserve power consumption. In some embodiments, the monitoring layer 212 is event driven, such as being activated upon power being provided to the dynamic pattern generator layer 202. In some embodiments, the monitoring layer 212 operates intermittently to periodically evaluate electrical performance of electrical components on the dynamic pattern generator layer 202. In some embodiments, the monitoring layer 212 sequentially evaluates electrical performance of electrical components on the dynamic pattern generator layer 202. In some embodiments, the monitoring layer 212 concurrently evaluates electrical performance of multiple electrical components on the dynamic pattern generator layer 202. Different monitoring or testing techniques by the monitoring or BIST layer 212 are contemplated herein.

Figure 4:
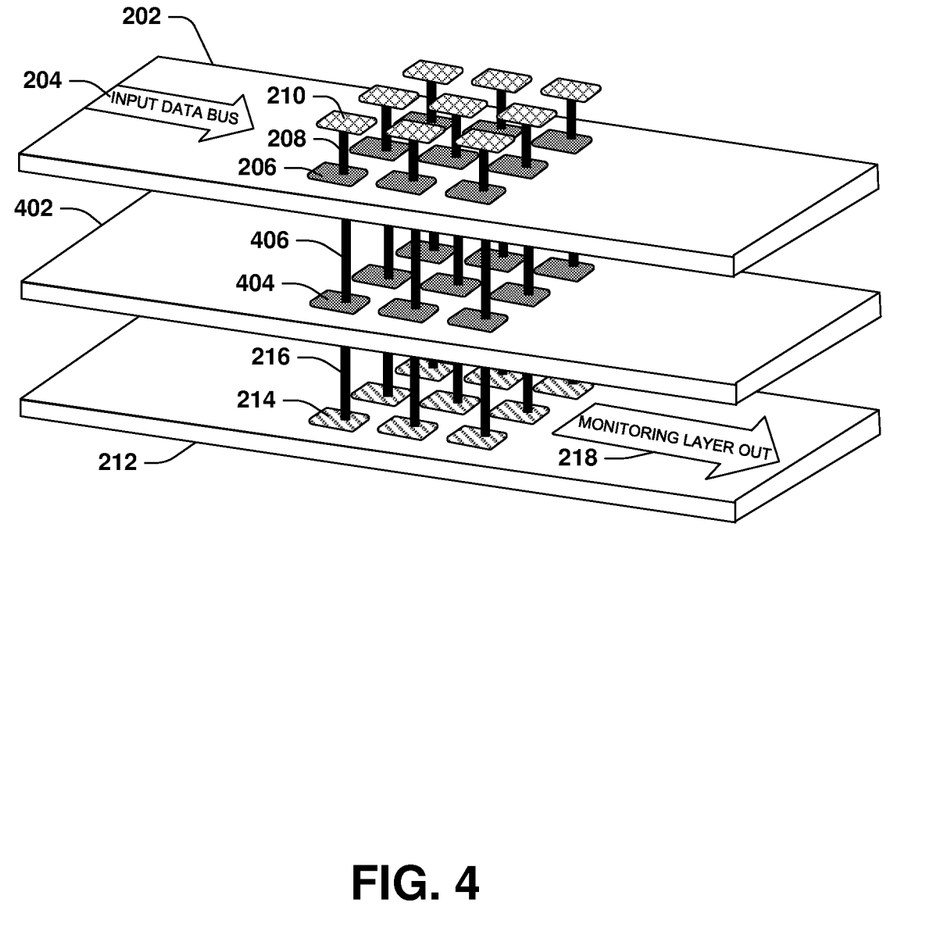
FIG. 4 is an illustration of a monitoring layer operatively coupled to a repair layer, and the repair layer operatively coupled to a dynamic pattern generator layer, according to some embodiments.

With reference to FIG. 4, a repair layer 402 is coupled to at least one of the dynamic pattern generator layer 202 or the monitoring layer 212, such as by one or more vias 216 or 406, according to some embodiments. In some embodiments, the output from the monitoring layer output bus 218 is provided to the repair layer 402. In some embodiments, the repair layer 402 is formed within the stacked semiconductor arrangement 100 illustrated in FIG. 1. In some embodiments, the repair layer 402 is formed as a separate physical layer from the dynamic pattern generator layer 202 and the monitoring layer 212 in the stacked semiconductor arrangement 100. In some embodiments, the repair layer 402 is formed above the dynamic pattern generator layer 202 in the stacked semiconductor arrangement 100. In some embodiments, the repair layer 402 is formed below the dynamic pattern generator layer 202 in the stacked semiconductor arrangement 100. In some embodiments, the repair layer 402 is formed between the dynamic pattern generator layer 202 and the monitoring layer 212 in the stacked semiconductor arrangement 100. In some embodiments, the monitoring layer 212 is formed between the dynamic pattern generator layer 202 and the repair layer 402 in the stacked semiconductor arrangement 100. In some embodiments, the repair layer 402 is formed as a stacked CMOS layer within the stacked semiconductor arrangement 100. In some embodiments, the repair layer 402 is formed within at least one of the second layer 104 or the third layer 106 of the stacked semiconductor arrangement 100 illustrated in FIG. 1.

The repair layer 402 comprises one or more repair electrical components configured to replace or substitute for defective electrical components, such as defective electrical components identified by the monitoring layer 212. In some embodiments, the repair layer 402 comprises a repair electrical component 404. The repair electrical component 404 is operatively coupled to the electrical component 206 by a second via 406. Responsive to a determination that the electrical component 206 is a defective electrical component, such as determined by the monitoring layer 212, the repair layer 402 replaces the defective electrical component with the repair electrical component 404 to repair the defective electrical component.

In some embodiments, the monitoring layer 212 tests electrical components to determine whether such electrical components are working electrical components or defective electrical components and the repair layer 402 is invoked to repair defective electrical components before a microelectromechanical systems (MEMS) process is performed, such as to provide electrical refraction functionality. In some embodiments, performing the MEMS process after testing electrical components and repairing defective electrical components reduces a rate of patterning defects and increases yield, as compared to when the MEMS process is performed after testing electrical components and repairing defective electrical components. The MEMS process forms an access opening to the pad 210 so that an electron beam reaches the pad 210. The pad 210 either refracts or absorbs the electron beam based upon whether the electrical component 206 or the repair electrical component 404 drives the pad 210 to the high voltage state or the low voltage state.

In some embodiments, the monitoring layer 212 is operatively coupled to the repair layer 402 by one or more vias 216, as illustrated in FIG. 4. In some embodiments, the repair layer 402 is operatively coupled to the dynamic pattern generator layer 202 by one or more vias 406, as illustrated in FIG. 4. In some embodiments, the monitoring layer 212 is comprised within the third layer 106 and the repair layer 402 is comprised within the second layer 104 of the stacked semiconductor arrangement 100 illustrated in FIG. 1, although other arrangements are contemplated. Although nine electrical components, nine pads, nine repair electrical components, and nine monitoring components are illustrated in FIGS. 2 and 4, differing numbers of the same are contemplated. The instant application, including the scope of the appended claims is not to be limited by the examples provided herein.

Figure 5:
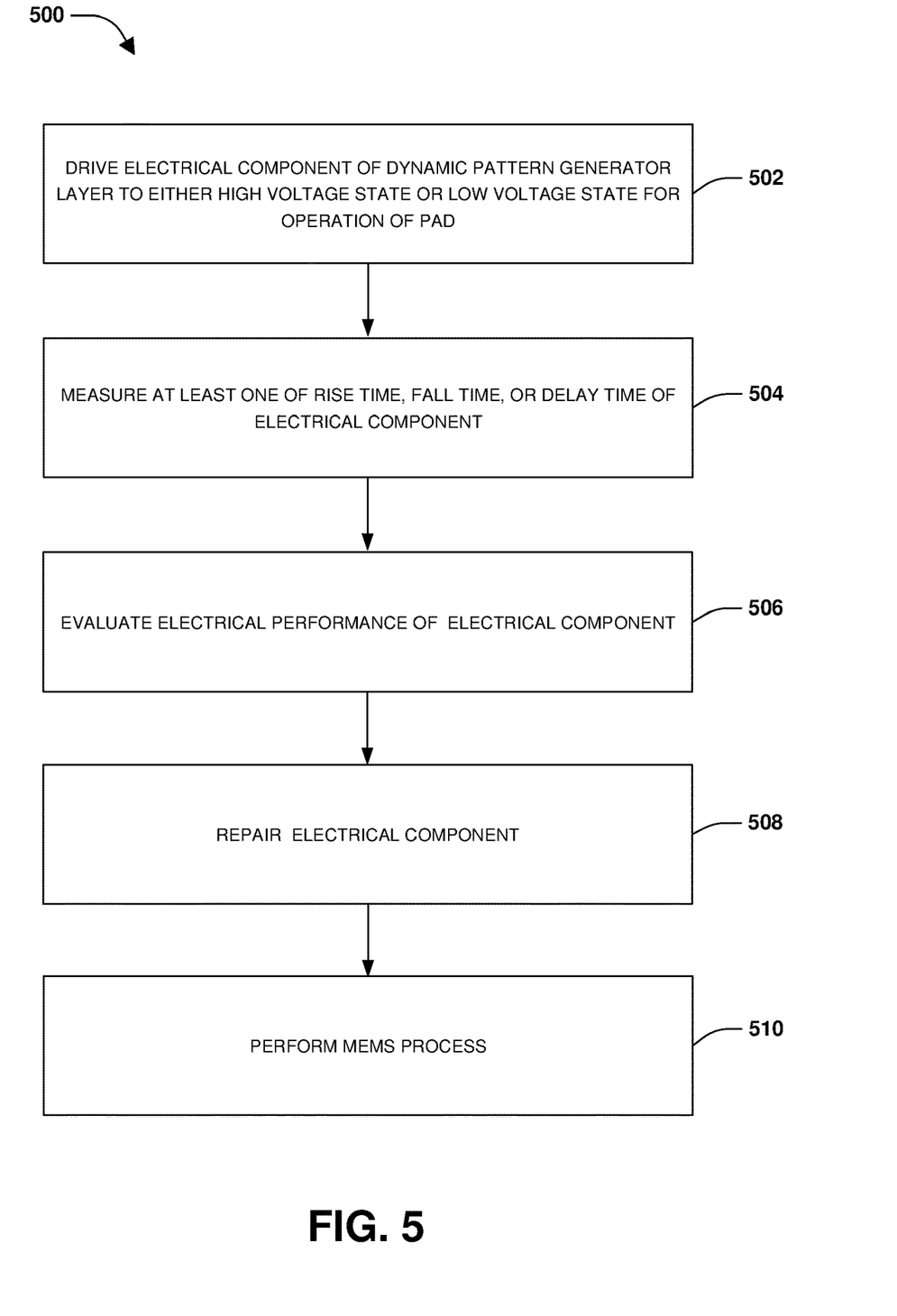
FIG. 5 is a flow diagram illustrating a method of evaluating a dynamic pattern generator layer of a stacked semiconductor arrangement, according to some embodiments.

FIG. 5 illustrates a method 500 of detecting and repairing a defective electrical component, such as the electrical component 206 of the dynamic pattern generator layer 202 illustrated in FIGS. 2 and 4. At 502, the electrical component 206 of the dynamic pattern generator layer 202 drives the pad 210 to either a high voltage state or a low voltage state. In some embodiments, when the pad 210 is driven to the high voltage state, the pad 210 refracts an electron beam towards the wafer 112 to form a pattern on the wafer 112. In some embodiments, when the pad 210 is driven to the low voltage state, the pad 210 absorbs the electron beam such that the electron beam is not refracted towards the wafer 112. At 504, at least one of a rise time, a fall time, or a delay time of the electrical component 206 is measured to obtain electrical performance characteristics for the electrical component 206. In some embodiments, the sensing circuitry 302 of the monitoring component 214 within the monitoring layer 212 senses the electrical performance characteristics of the electrical component 206. At 506, the electrical performance characteristics of the electrical component 206 are evaluated to determine whether the electrical component 206 is defective. In some embodiments, if at least one of the rise time, the fall time, or the delay time do not match expected values, then the electrical component 206 is determined to be defective. At 508, responsive to the electrical component 206 being determined to be defective, the electrical component 206 is repaired. In some embodiments, the repair layer 402 is invoked to repair the electrical component 206 replacing or substituting operation of the electrical component 206 with operation of the repair electrical component 404. In some embodiments, repairing the electrical component 206 includes disabling the electrical component 206. In this way, the repair electrical component 404 is configured to drive the pad 210 to either refract an electron beam towards the wafer 112 or absorb the electron beam. In some embodiments, at 510, responsive to evaluating and repairing one or more electrical components, the MEMS process is performed. In some embodiments, performing the MEMS process after the electrical performance characteristics are obtained and evaluated, and after the electrical component 206 is repaired if necessary, results in a lower rate of patterning defects and a higher yield than if the electrical component 206 was defective but had not been repaired.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a stacked semiconductor arrangement is provided. The stacked semiconductor arrangement comprises a dynamic pattern generator layer. The dynamic pattern generator layer comprises an electrical component. The stacked semiconductor arrangement comprises a monitoring layer. The monitoring layer comprises a monitoring component. The monitoring component is configured to evaluate electrical performance of the electrical component.

According to an aspect of the instant disclosure, a stacked semiconductor arrangement is provided. The stacked semiconductor arrangement comprises a dynamic pattern generator layer. The dynamic pattern generator layer comprises an electrical component. The stacked semiconductor arrangement comprises a repair layer. Responsive to a determination that the electrical component is defective, the repair layer repairs the electrical component.

According to an aspect of the instant disclosure, a method for evaluating a dynamic pattern generator layer of a stacked semiconductor arrangement is provided. The method comprises driving an electrical component of the dynamic pattern generator layer. Electrical performance of the electrical component is evaluated responsive to the driving.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for evaluating a dynamic pattern generator layer of a stacked semiconductor arrangement, comprising:
placing a pad, onto which an electron beam is incident, into a first voltage state by an electrical component, of the dynamic pattern generator layer, to which the pad is operatively coupled;
placing the pad into a second voltage state, different than the first voltage state, by the electrical component;
evaluating electrical performance of the electrical component in placing the pad into the first voltage state and into the second voltage state, wherein evaluating the electrical performance of the electrical component comprises:
during a first time interval during which the pad is in the first voltage state or the second voltage state, evaluating the electrical performance of the electrical component; and
during a second time interval during which the pad is in the first voltage state or the second voltage state, not evaluating the electrical performance of the electrical component, wherein the second time interval is different than the first time interval;
repairing the electrical component in response to the evaluation of the electrical performance indicating that the electrical component is a defective electrical component, wherein repairing the electrical component comprises substituting the defective electrical component with a repair electrical component; and
invoking a micromechanical systems (MEMS) process to form an access opening to the pad after substituting the defective electrical component with the repair electrical component.

2. The method of claim 1, wherein:
placing the pad into the second voltage state comprises transitioning the pad from the first voltage state to the second voltage state, and
evaluating the electrical performance of the electrical component comprises:
measuring at least one of a rise time, a fall time, or a delay time associated with the electrical component while transitioning the pad from the first voltage state to the second voltage state.

3. The method of claim 1, wherein repairing the electrical component comprises:
invoking a repair layer to repair the electrical component.

4. The method of claim 3, wherein the repair electrical component is comprised within the repair layer.

5. The method of claim 1, comprising:
applying a pattern, to a wafer, utilizing the electron beam while the pad is in the first voltage state.

6. The method of claim 1, wherein:
placing the pad into the second voltage state comprises transitioning the pad from the first voltage state to the second voltage state, and
evaluating the electrical performance of the electrical component comprises:
measuring a switching time for transitioning the pad from the first voltage state to the second voltage state.

7. The method of claim 1, wherein the dynamic pattern generator layer comprises a plurality of other electrical components and the method comprises evaluating electrical performance of each of the plurality of other electrical components sequentially after the electrical performance of the electrical component has been evaluated.

8. The method of claim 1, wherein the dynamic pattern generator layer comprises a second electrical component and the method comprises evaluating electrical performance of the second electrical component concurrently with evaluating the electrical performance of the electrical component.

9. The method of claim 1, wherein:
evaluating the electrical performance of the electrical component comprises comparing at least one of a rise time, a fall time, or a delay time associated with the electrical component to a specified rise time, a specified fall time, or a specified delay time, and
repairing the electrical component comprises invoking a repair layer to repair the electrical component when the at least one of a rise time, a fall time, or a delay time associated with the electrical component is different than the specified rise time, the specified fall time, or the specified delay time.

10. A method for evaluating a dynamic pattern generator layer of a stacked semiconductor arrangement, comprising:
placing a pad, onto which an electron beam is incident, into a first voltage state by an electrical component, of the dynamic pattern generator layer, to which the pad is operatively coupled;
placing the pad into a second voltage state, different than the first voltage state, by the electrical component;
evaluating electrical performance of the electrical component in placing the pad into the first voltage state and into the second voltage state;
repairing the electrical component in response to the evaluation of the electrical performance indicating that the electrical component is a defective electrical component, wherein repairing the electrical component comprises substituting the defective electrical component with a repair electrical component; and
invoking a micromechanical systems (MEMS) process to form an access opening to the pad after substituting the defective electrical component with the repair electrical component.

11. The method of claim 10, comprising:
applying a pattern, to a wafer, utilizing the electron beam while the pad is in the first voltage state.

12. The method of claim 10, wherein the dynamic pattern generator layer comprises a plurality of other electrical components and the method comprises evaluating electrical performance of each of the plurality of other electrical components sequentially after the electrical performance of the electrical component has been evaluated.

13. The method of claim 10, wherein the dynamic pattern generator layer comprises a second electrical component and the method comprises evaluating electrical performance of the second electrical component concurrently with evaluating the electrical performance of the electrical component.

14. A method for evaluating a dynamic pattern generator layer of a stacked semiconductor arrangement, comprising:
placing a pad into a first voltage state by an electrical component, of the dynamic pattern generator layer, to which the pad is operatively coupled;

placing the pad into a second voltage state, different than the first voltage state, by the electrical component;

evaluating electrical performance of the electrical component in placing the pad into the first voltage state and into the second voltage state, wherein evaluating the electrical performance of the electrical component comprises:

during a first time interval during which the pad is in the first voltage state or the second voltage state, evaluating the electrical performance of the electrical component; and during a second time interval during which the pad is in the first voltage state or the second voltage state, not evaluating the electrical performance of the electrical component, wherein the second time interval is different than the first time interval; and repairing the electrical component in response to the evaluation of the electrical performance indicating that the electrical component is a defective electrical component, the repairing comprising using a repair electrical component in place of the defective electrical component, wherein using the repair electrical component in place of the defective electrical component comprises:

substituting the defective electrical component with the repair electrical component; and invoking a micromechanical systems (MEMS) process to form an access opening to the pad after substituting the defective electrical component with the repair electrical component.

15. The method of claim 14, wherein the pad is configured to control an absorption of an electron beam based upon a voltage state of the pad.

16. The method of claim 14, wherein:

placing the pad into the second voltage state comprises transitioning the pad from the first voltage state to the second voltage state, and evaluating the electrical performance of the electrical component comprises:

measuring a switching time for transitioning the pad from the first voltage state to the second voltage state.

17. The method of claim 14, wherein:

evaluating the electrical performance of the electrical component comprises comparing at least one of a rise time, a fall time, or a delay time associated with the electrical component to a specified rise time, a specified fall time, or a specified delay time.

18. The method of claim 14, wherein the dynamic pattern generator layer comprises a second electrical component and the method comprises evaluating electrical performance of the second electrical component concurrently with evaluating the electrical performance of the electrical component.

19. The method of claim 14, wherein the dynamic pattern generator layer comprises a plurality of other electrical components and the method comprises evaluating electrical performance of each of the plurality of other electrical components sequentially after the electrical performance of the electrical component has been evaluated.

20. The method of claim 14, comprising:

applying a pattern, to a wafer, utilizing an electron beam while the pad is in the first voltage state.

* * * * *